(12) United States Patent
Ibelings et al.

(10) Patent No.: US 6,242,982 B1
(45) Date of Patent: Jun. 5, 2001

(54) AMPLIFIER WITH SELF SETTING AUTOMATIC GAIN CONTROL CIRCUIT

(75) Inventors: Pieter G. Ibelings, Norcross; Herman A. Kruse, Winder, both of GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/438,014

(22) Filed: Nov. 10, 1999

(51) Int. Cl.[7] ................. H03G 3/10; H03G 3/20
(52) U.S. Cl. ............ 330/279; 330/289; 330/129; 455/200.1; 455/234.1; 455/73
(58) Field of Search .................. 330/129, 279, 330/289; 455/200.1, 232.1, 234.1, 245.1, 73

(56) References Cited

U.S. PATENT DOCUMENTS 3,601,120 * 8/1971 Massie .................. 128/2.055
5,852,770 * 12/1998 Kasamatsu ............ 330/129

\* cited by examiner

*Primary Examiner*—Michael B Shingleton
(74) *Attorney, Agent, or Firm*—Hubert J. Barnhardt, III; Kenneth M. Massaroni; Kelly A. Gardner

(57) ABSTRACT

An amplifier (125) having automatic gain control (AGC) includes a gain stage (220), having a variable amplifier (215), for amplifying a signal received by the amplifier (125). The amplifier (125) also includes an AGC circuit (228) that adjusts amplification of the gain stage (220) and that includes a manual switch (246) having first and second switch settings. Sequential operation from the first switch setting to the second switch setting causes the AGC circuit (228) to automatically and correctly set the gain of the amplifier (125) without further human intervention.

16 Claims, 2 Drawing Sheets

AMPLIFIER WITH SELF SETTING AUTOMATIC GAIN CONTROL CIRCUIT

FIELD OF THE INVENTION

This invention relates generally to amplifiers, and more specific purifiers that include automatic gain control (AGC) circuits.

BACKGROUND OF THE INVENTION

Communication systems often include amplifiers to boost signal levels, and automatic gain control (AGC) circuits are typically used to monitor and control the gain of such amplifiers. In conventional amplifiers, such as those included in cable television systems, the setup of the AGC circuits has been cumbersome because reference levels for numerous amplifiers throughout a cable television system often have to be monitored. Additionally, for each amplifier in the system, the reference level is used by a technician to calculate the value for each attenuator pad used in each AGC circuit, and the attenuator pads are adjusted manually, such as by setting a variable resistor. This tedious, labor-intensive process easily results in set up errors that can, in turn, lead to improper operation of the cable television system. Furthermore, changes in the settings of the variable resistors, over time or as a result of environmental factors, can add an even greater potential for system errors.

DETAILED DESCRIPTION OF A PREFERRED EMBODIMENT

Figure 1:
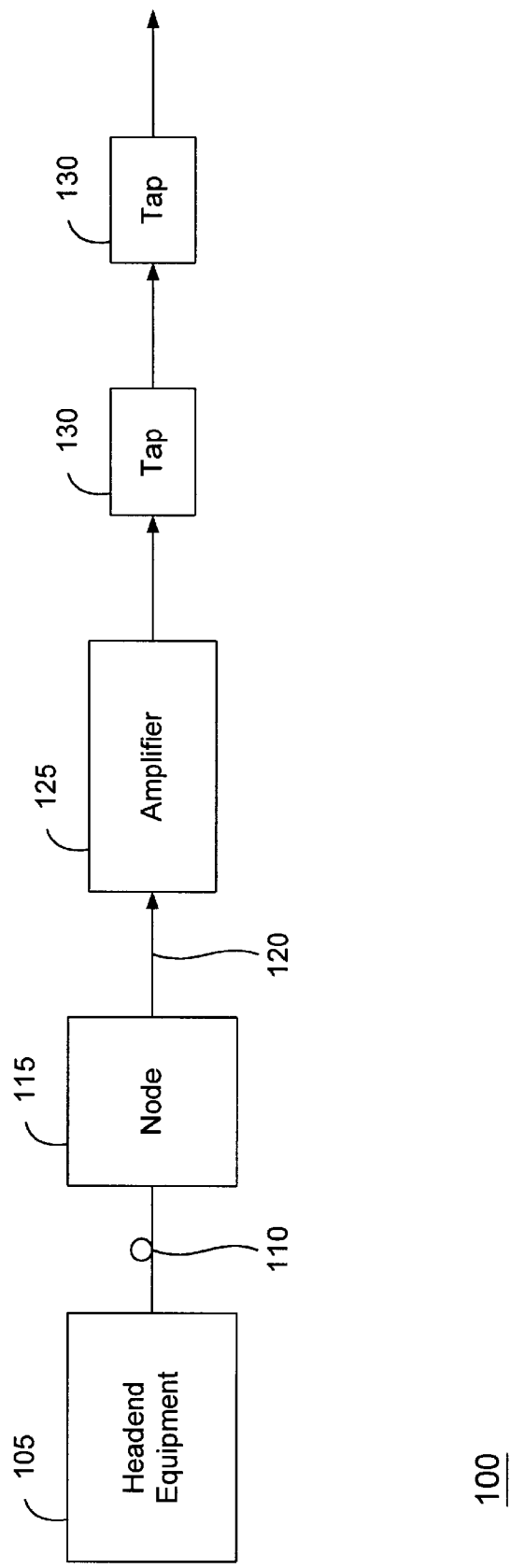
FIG. 1 is a block diagram of a communication system that includes an amplifier in accordance with the present invention.

FIG. 1 is a block diagram of a communication system, such as a cable television system 100, including a plurality of devices. More specifically, when the communication system comprises a cable television system 100, the system 100 includes a transmitter, such as headend equipment 105, for receiving satellite signals, demodulating the signals down to baseband, then retransmitting the signals to subscriber equipment located at subscriber residences and businesses. The headend equipment 105 can, for instance, transmit optical signals over fiber optic cable 110 to a node 115 located in the field for converting the optical signals to radio frequency (RF) signals. The radio frequency signals are further transmited over an electrical communication medium, such as coaxial cable 120, to additional remote receiving equipment such as amplifiers 125 for boosting signal levels over extended distances. Cable taps 130 are also included in the system 100 for splitting off the signal to provide subscriber drops that are coupled to receivers, e.g., subscriber equipment (not shown) that can include set top terminals, computers, and modems.

As mentioned briefly in the Background of the Invention, amplifiers 125 often include automatic gain control (AGC) circuits for maintaining signal levels at predetermined levels. In prior art amplifiers, the AGC circuits are set manually, in a time consuming and error-prone process, and are subject to variations over time. An amplifier 125 according to the present invention, on the other hand, includes a self setting AGC circuit that eliminates many of the problems associated with prior art amplifiers.

Figure 2:
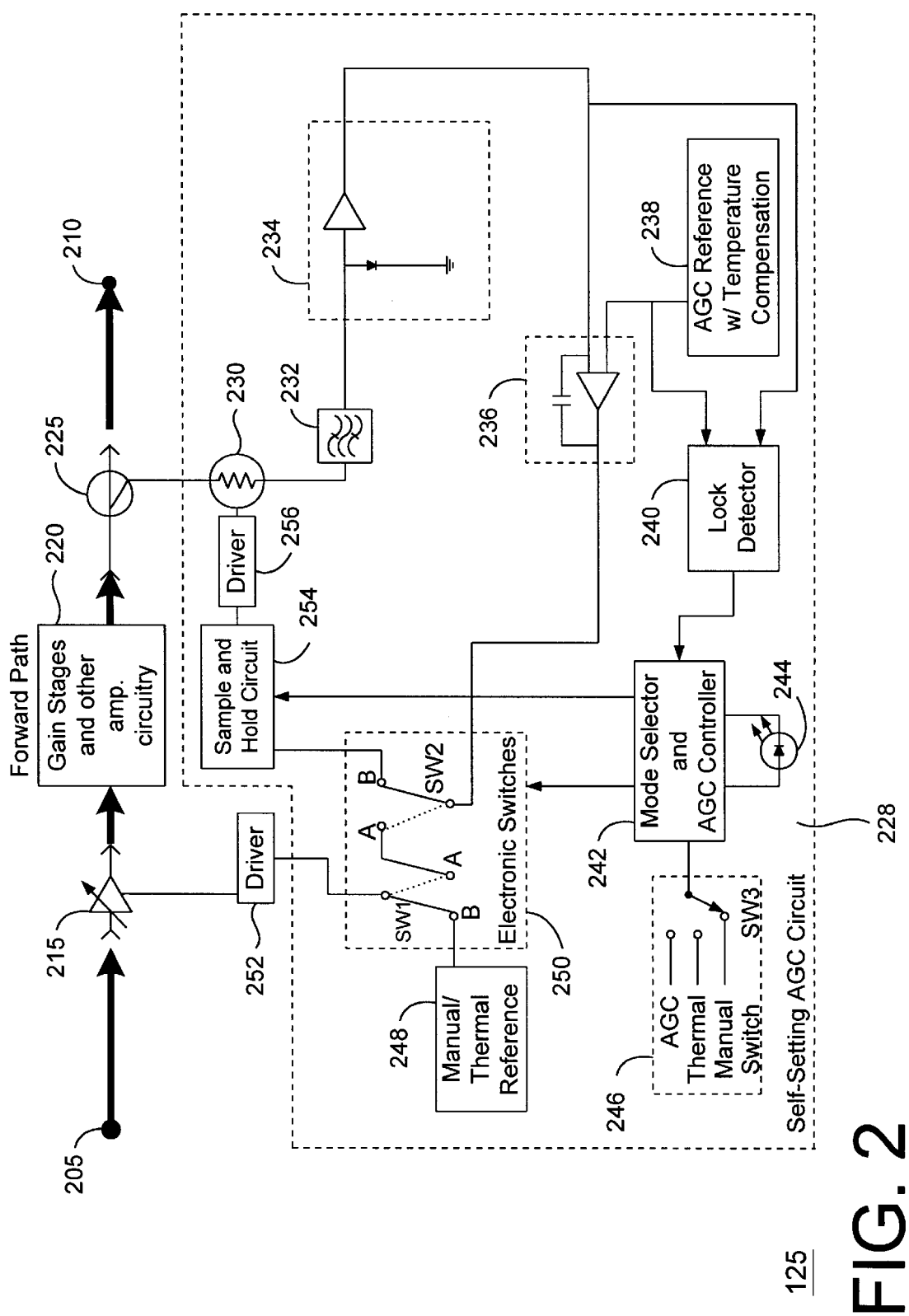
FIG. 2 is an electrical block diagram of the amplifier of FIG. 1, including a self setting automatic gain control module in accordance with the present invention.

Referring next to FIG. 2, an electrical block diagram of an amplifier 125 according to the present invention is depicted. The amplifier 125 includes an input port 205 for receiving electrical signals and an output port 210 for providing amplified signals for further distribution throughout the cable television system 100 (FIG. 1). The forward path circuitry coupled between the input and output ports 205, 210 includes a conventional variable amplifier or Bode network 215 as well as gain stages and other forward circuitry 220. At the output of the gain stages 220, a directional coupler 225 splits off a portion of the signal for use by a self setting AGC circuit 228.

The self setting AGC circuit 228 includes a voltage variable attenuator 230 coupled between the directional coupler 225 and a bandpass filter 232. An input of a video amplifier/peak detector circuit 234 is coupled to an output of the bandpass filter 232, and the output of the video amplifier/peak detector circuit 234 is coupled to a first input of an integrator/error amplifier circuit 236. A second input of the integrator/error amplifier circuit 236 is coupled to an AGC reference circuit 238 that provides a reference voltage and temperature compensation The output of the integrator/error amplifier circuit 236 is coupled to an electronic switch 250.

The AGC circuit 228 further includes a lock detector 240 having first and second inputs coupled to the output of the video amplifier/peak detector circuit 234 and the output of the AGC reference circuit 238. The lock detector output is coupled to a controller 242, which provides mode selection and controls the AGC circuit 228. A manual switch 246 is also coupled to the controller 242. The manual switch 246 permits a technician to manually switch the AGC circuit 228 to an AGC mode, a thermal mode, or a manual mode. An indicator, such as a light emitting diode (LED) 244, is coupled to the controller 242 for emitting light to indicate various circuit status information. The controller 242 and the lock detector 240 can, for instance, be implemented through use of a microprocessor and executable software code. Alternatively, hardware for performing equivalent operations could be used instead of a software implementation.

The controller 242 includes at least two outputs. A first output is coupled to the electronic switch 250, which also receives an input reference voltage from a manual/thermal reference circuit 248 when the AGC circuit 228 is set to either the thermal mode or the manual mode. A second output of the controller 242 is coupled to a conventional sample and hold circuit 254 for the control thereof. The sample and hold circuit 254 can be coupled, via the electronic switch 250, to receive the output of the integrator/error amplifier circuit 236, and the output of the sample and hold circuit 254 is coupled to a driver 256 for adjusting the voltage variable attenuator 230.

The electronic switch 250 includes two electronic switches that are under the control of the controller 242. The first electronic switch, SW1, couples and decouples the manual/thermal reference circuit output to and from, respectively, a driver 252 for driving the variable amplifier or Bode network 215, and the second switch, SW2, couples and decouples the output of the integrator/error amplifier circuit 236 to and from, respectively, the input of the sample and hold circuit 254, as mentioned above.

In accordance with the present invention, the AGC circuit 228 automatically sets up its gain, thereby eliminating attenuator pads and gain adjusting potentiometers that are found in prior art amplifiers. Furthermore, the setup process can be accomplished quickly and easily since the only task performed by a technician is the setting of the manual switch 246.

The setup process begins when a technician sets the manual switch 246 to either the thermal setting or the manual setting. For purposes of AGC setup, manual mode and thermal mode will result in the same AGC setup; however, both modes are shown with respect to the manual switch 246 since, after AGC setup, there may be some advantages to operating in the different modes.

When the switch 246 is set to "manual" or "thermal," controller 242 couples reference circuit 248 to the Bode driver 252 to drive the Bode network 215 to the desired operating level for the current temperature, which results in automatic padding and equalization of desired amplifier output levels and tilts. The controller 242 also couples the output of the integrator/error amplifier circuit 236 to the sample and hold circuit 254 such that the voltage variable attenuator 230 is electronically adjusted until inputs to the integrator/error amplifier circuit 236 are equivalent, i.e., until there is no difference between the AGC reference voltage and the detected level error. At this time, the lock detector output indicates that a gain lock has been achieved, and the controller 242 activates the LED 244 to indicate this status to the technician.

After gain lock has been achieved, the technician sets the manual switch 246 to the AGC mode. The AGC circuit 228 waits until the output of the lock detector 240 indicates that the loop has locked, thus eliminating possible gain errors that could be introduced if the voltage variable attenuator loop was not permitted to settle. Once the loop has locked, the sample and hold circuit 254 samples, via the electronic switch 250, the voltage at the voltage variable attenuator 230. Electronic switches SW1 and SW2 are both then switched by the controller 242 to their respective "A" positions, as shown in FIG. 2. Switching of the electronic switches in this manner couples the Bode driver 252 to the output of the integrator/error amplifier circuit 236. The Bode driver 252 adjusts the Bode network 215 until there is no difference between the AGC reference voltage, provided by the AGC reference circuit 238, and the detected level error, provided by the video amplifier/peak detector circuit 234. At this point, the controller 242 directs the sample and hold circuit 254 to hold the voltage that it has been sampling and to thereby set the voltage variable attenuator 230. The AGC circuit 228 is, in this manner, locked to the correct amplifier gain. Any level changes will now be compensated for by automatic adjustment of the Bode network loss.

In conventional AGC gain setting processes, unlike that of the present invention, an AGC circuit is placed into either the manual or thermal mode, in which mode the amplifier is padded and equalized to desired amplifier output levels and tilts. In prior art processes, after completion of this step, the AGC circuit is placed in the AGC mode by the technician. While the amplifier is in the AGC mode, the technician is required to vary a potentiometer to equalize the levels between the AGC mode and the thermal/manual mode. In order for adjustment of the gain adjust potentiometer to result in setting of the AGC circuit, the technician first has to look up a reference level for the amplifier. The reference level must then be used to calculate the pad value required for the AGC gain adjustment, and this pad value can sometimes be set to an incorrect value as a result of tolerance effects in the AGC circuit. Incorrect pad value selection, in turn, prevents proper setting of the AGC circuit. Even if the correct pad is calculated and selected, the technician must then adjust the gain adjust potentiometer to equal the signal level observed in the manual/thermal mode. This process normally requires flipping the AGC switch on and off several times while adjusting the potentiometer until the two levels are equal, which can be very time consuming.

Conversely, the AGC circuit 288 of the present invention and its resulting setup process reduces the likelihood of human error since a technician can set the gain of the AGC circuit 228 simply by setting a single manual switch 246. More specially, the manual switch has first and second settings. Sequential operation from the first setting, i.e., manual/thermal mode, to the second setting, i.e., AGC mode, causes the AGC circuit 228 to automatically set gain of the amplifier 125 without further human intervention. This is done by using an AGC circuit 228 that includes a variable attenuator 230 for attenuating a signal that is split off from the gain stage 220 to generate an error signal and that also includes a reference circuit 238 for generating a reference signal. A comparator, i.e., the integrator/error amplifier circuit 236, compares the error signal and the reference signal and generates a predetermined output when the error signal and the reference signal are equivalent. The controller 242 then sets attenuation of the variable attenuator 230 and sets the gain of the variable amplifier 215 until the error signal and the reference signal are equivalent, thereby setting the gain of the amplifier 125 in an automatic, simplified process.

It will be appreciated by now that there has been provided a quick and efficient way to set gain of amplifiers while reducing the likelihood of setup errors.

What is claimed is:

1. An amplifier having automatic gain control (AGC), the amplifier comprising:

a gain stage, including a variable amplifier, for amplifying a signal received by the amplifier; and an AGC circuit for adjusting amplification of the gain stage, the AGC circuit comprising:

a manual switch having first and second switch settings, wherein sequential operation from the first switch setting to the second switch setting causes the AGC circuit to automatically set gain of the amplifier without further human intervention, wherein placement of the manual switch to the first switch setting results in adjustment of the gain of the variable amplifier at a temperature.

2. The amplifier of claim 1, wherein placement of the manual switch to the second switch setting, after the gain of the variable amplifier at the temperature has been set, results in locking of the AGC circuit to a correct amplifier gain.

3. The amplifier of claim 2, wherein the amplifier further comprises a directional coupler at an output of the gain stage for splitting off the signal.

4. The amplifier of claim 3, wherein the AGC circuit further comprises:

a variable attenuator coupled to the directional coupler for attenuating the signal to generate an error signal;

a reference circuit for generating a reference signal;

a comparator coupled to the variable attenuator and the reference circuit for comparing the error signal and the reference signal and for generating a predetermined output when the error signal and the reference signal are equivalent; and a controller coupled to the comparator for setting attenuation of the variable attenuator and setting the gain of the variable amplifier until the error signal and the reference signal are equivalent.

5. The amplifier of claim 4, further comprising an indicator coupled to the controller, wherein the indicator is activated to indicate when the error signal and the reference signal equivalent.

6. An amplifier having automatic gain control (AGC), the amplifier comprising:

a gain stage, including a variable amplifier, for amplifying a signal received by the amplifier;

a directional coupler coupled to an output of the gain stage for splitting off the signal; and an AGC circuit for adjusting amplification of the gain stage, the AGC circuit comprising:
  a manual switch having first and second settings, wherein sequential operation from the first setting to the second setting causes the AGC circuit to automatically set gain of the variable amplifier without further human intervention, wherein placement of the manual switch to the first switch setting results in adjustment of the gain of the variable amplifier at a temperature;
  a variable attenuator coupled to the directional coupler for attenuating the signal that is split off from the gain stage to generate an error signal;
  a reference circuit for generating a reference signal;
  a comparator coupled to the variable attenuator and the reference circuit for comparing the error signal and the reference signal and for generating a predetermined output when the error signal and the reference signal are equivalent; and
  a controller coupled to the comparator for setting attenuation of the variable attenuator and setting the gain of the variable amplifier until the error signal and the reference signal are equivalent, thereby setting the gain of the amplifier.

7. The amplifier of claim 6, further comprising:
an input port for receiving the signal; and
an output port for providing the signal after it has been amplified.

8. The amplifier of claim 7, further comprising an indicator coupled to the controller, wherein the indicator is activated to indicate when the gain of the amplifier has been set.

9. The amplifier of claim 8, wherein the indicator comprises a light emitting diode.

10. The amplifier of claim 8, wherein the amplifier comprises a distribution amplifier included in a cable television system.

11. A communication system for providing information, the communication system comprising:
a transmitter for transmitting a signal including the information;
a receiving for receiving the signal; and
an amplifier coupled between the transmitter and the receiver for amplifying the signal, the amplifier comprising:
  a gain stage, including a variable amplifier, for amplifying the signal received by the amplifier; and
  an automatic gain control (AGC) circuit for adjusting amplification of the gain stage, the AGC circuit comprising a manual switch having first and second switch settings, wherein sequential operation from the first switch setting to the second switch setting causes the AGC circuit to automatically set gain of the amplifier without further human intervention wherein placement of the manual switch to the first switch setting results in adjustment of the gain of the variable amplifier at a temperature.

12. The communication system of claim 11, wherein placement of the manual switch of the amplifier to the second switch setting, after the gain of the variable amplifier at the temperature has been set, results in locking of the AGC circuit to a correct amplifier gain.

13. The communication system of claim 12, wherein the amplifier further comprises a directional coupler coupled to an output of the gain stage for splitting off the signal.

14. The communication system of claim 13, wherein the AGC circuit of the amplifier further comprises:
a variable attenuator coupled to the directional coupler for attenuating the signal to generate an error signal;
a reference circuit for generating a reference signal;
a comparator coupled to the variable attenuator and the reference circuit for comparing the error signal and the reference signal and for generating a predetermined output when the error signal and the reference signal are equivalent; and
a controller coupled to the comparator for setting attenuation of the variable attenuator and setting the gain of the variable amplifier until the error signal and the reference signal are equivalent, thereby setting the gain of the amplifier.

15. The communication system of claim 14, wherein the amplifier further comprising an indicator coupled to the controller, wherein the indicator is activated to indicate when the gain of the amplifier has been set.

16. The communication system of claim 11, wherein the communication system comprises a cable television system, the transmitter comprises headend equipment, and the receiver comprises cable television taps.

* * * * *

UNITED STATES PATENT AND TRADEMARK OFFICE
CERTIFICATE OF CORRECTION

PATENT NO.     : 6,242,982 B1
DATED          : June 5, 2001
INVENTOR(S)    : Ibelings et al.

It is certified that error appears in the above-identified patent and that said Letters Patent is hereby corrected as shown below:

Column 1,
Line 6, delete "specific purifiers" and insert therefore -- specifically to amplifers --
Line 51, delete "transmited" and insert therefore -- transmitted --

Column 2,
Line 22, delete "compensation The" and insert therefor -- compensation. The --

Column 4,
Line 65, insert -- are -- between "signal" and "equivalent"

Signed and Sealed this

Eleventh Day of December, 2001

Attest:

NICHOLAS P. GODICI
Attesting Officer
Acting Director of the United States Patent and Trademark Office